(12) United States Patent
Mellinger et al.

(10) Patent No.: US 6,967,709 B2
(45) Date of Patent: Nov. 22, 2005

(54) OVERLAY AND CD PROCESS WINDOW STRUCTURE

(75) Inventors: Daniel J. Mellinger, Essex Junction, VT (US); Timothy C. Milmore, South Burlington, VT (US); Matthew C. Nicholls, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,198

(22) Filed: Nov. 26, 2003

(65) Prior Publication Data

US 2005/0110969 A1 May 26, 2005

(51) Int. Cl.⁷ .................... G03B 27/42; G03B 27/32; G03F 9/00
(52) U.S. Cl. .............. 355/53; 355/77; 430/22
(58) Field of Search .............. 355/52, 53, 55, 355/67, 77; 382/144; 430/22, 30

(56) References Cited

U.S. PATENT DOCUMENTS

| | | | |
|---|---|---|---|
| 5,087,537 A | | 2/1992 | Conway et al. |
| 5,936,738 A | | 8/1999 | Liebmann et al. |
| 6,317,211 B1 | | 11/2001 | Ausschnitt et al. |
| 6,373,975 B1 | * | 4/2002 | Bula et al. .................. 382/144 |
| 6,521,745 B1 | | 2/2003 | Murdin et al. |
| 6,670,632 B1 | * | 12/2003 | Fujimoto ..................... 257/48 |
| 6,716,559 B2 | * | 4/2004 | Leidy et al. .................. 430/22 |
| 2004/0091142 A1 | * | 5/2004 | Peterson et al. ............ 382/144 |

* cited by examiner

Primary Examiner—Henry Hung Nguyen
(74) Attorney, Agent, or Firm—Scully, Scott, Murphy & Presser; William D. Sabo, Esq.

(57) ABSTRACT

The present invention provides photolithographic device and method for optimizing the photolithography process window. The photolithography device comprises a substrate; and a pattern layer having radiant energy transparent portions and radiant energy blocking portions, where the pattern layer has features with a varying overlay. The overlay tolerance is determined by varying the misalignment the features of the pattern. The photolithography device is a reticle. The method for determining an optimum photolithography process window comprises exposing a portion of a wafer to a pattern produced by a reticle, the pattern having a varying overlay that produces multiple photolithography conditions, wherein each photolithography condition has an overlay tolerance; and stepping the reticle across a remaining portion of the wafer, where each step exposes an other region of the wafer to the pattern producing multiple photolithography conditions. This process enables the user to determine the lithographic process window for critical dimension and overlay on a single chip using electrical test structures.

8 Claims, 4 Drawing Sheets

FIG. 1

← INCREASING OVERLAY DECREASING →

↑ INCREASING CD

| X+3, Y+3 | X+2, Y+3 | X+1, Y+3 | X, Y+3 | X-1, Y+3 | X-2, Y+3 | X-3, Y+3 |
|---|---|---|---|---|---|---|
| X+3, Y+2 | X+2, Y+2 | X+1, Y+2 | X, Y+2 | X-1, Y+2 | X-2, Y+2 | X-3, Y+2 |
| X+3, Y+1 | X+2, Y+1 | X+1, Y+1 | X, Y+1 | X-1, Y+1 | X-2, Y+1 | X-3, Y+1 |
| X+3, Y | X+2, Y | X+1, Y | X, Y | X-1, Y | X-2, Y | X-3, Y |
| X+3, Y-1 | X+2, Y-1 | X+1, Y-1 | X, Y-1 | X-1, Y-1 | X-2, Y-1 | X-3, Y-1 |
| X+3, Y-2 | X+2, Y-2 | X+1, Y-2 | X, Y-2 | X-1, Y-2 | X-2, Y-2 | X-3, Y-2 |

10

OVERLAY AND CD PROCESS WINDOW STRUCTURE

BACKGROUND OF INVENTION

1. Field of Invention

This invention relates generally to semiconductor wafer manufacturing, and, more particularly, to photolithography and methods for producing the optimal critical dimension and overlay process window on a single chip.

2. Background of the Invention

Photolithography has a broad range of industrial applications, including the manufacture of semiconductors, flat panel displays, micromachines and disk heads. In many of these applications, multiple patterns are formed over, or on top of, one another. For example, integrated circuits may be made by using a series of photolithographic steps to form several layers of patterns on an underlying semiconductor substrate on which the integrated circuit is being made. Each layer may include patterns that are formed on or above patterns of one or more lower layers. The manufacture of semiconductor wafers requires a number of process steps to create a packaged semiconductor device from raw semiconductor material.

Photolithography requires precise alignment between the pattern on the reticle or photomask and the existing features on the wafer surface. This quality measure is known as overlay accuracy. Alignment is critical because the pattern features must be precisely transferred to the wafer from layer to layer. Overlay misalignment contributes to the total placement tolerances between the different features on the wafer surface. The range of alignment between the critical features and the range of critical dimensions for those critical features that produce functioning devices is known as overly tolerance. Overlay tolerance is determined by the points at which misalignment results in a failing device, where the features of a multilevel device either overlap other critical features at another level (if they are intended to not interact) or where they do not interact (when they are intended to interact). The tolerance between these failure mechanisms is important in understanding and controlling the photolithography process in preventing electrical shorts, opens, or other failures. Determining the overlay tolerance is beneficial to both single layer and multilayer device processing.

Various techniques are known to determine the optimum sizes of the patterns that are formed on the substrate. Process window experiments in photolithography typically consist of focus exposure matrices or wafer striping, where image size is varied across the wafer to determine the optimum image size that produces the best yielding chips. Process window experiments have no direct bearing on yield because they are used to determine the limitation of the process for each level and do not take into account the interaction between the multiple levels of a single wafer. Additionally, neither of these procedures consider the effect of varying the feature alignment within the pattern of reticle for determining the overlay tolerance for the optimum process window.

U.S. Patent Application No. 20030113641 to Leidy, et al. discloses a method for determining overlay tolerance by varying the overlay tolerance across the wafer in a manner similar to wafer striping for a constant critical dimension per each wafer. Leidy, et al. disclose exposing wafers at different critical dimensions; varying overlay tolerance for each wafer through process tooling and then using functional yield data to determine the overlay tolerance for each of the image sizes. The overlay tolerance is varied by increasing or decreasing the tooling magnification. Leidy, et al. requires processing an entire lot of wafers, where each wafer has a different critical dimension, in order to optimize the photolithography process window.

The above disclosed methods of process window optimization result in a large number of wafers routinely scraped during the optimization process. The increased consumption of raw materials during process optimization is further amplified by increasing wafer size. What is needed is a method for optimizing photolithography processing steps using a single test wafer.

SUMMARY OF INVENTION

An object of the present invention is to provide a method for determining the optimal photolithography process window using a reduced number of test wafers. Another object of the present invention is to determine overlay tolerance for providing the optimal photolithography process window. The overlay tolerance is determined by varying the overlay, where the overlay is varied by intentionally misaligning the features of the reticle pattern.

The present invention exploits the interaction of feature alignment, image size (also referred to as critical dimension) and regionality effects to determine the overlay tolerance in optimizing the photolithography process window. Prior to this invention, the only way to attain this information was to process a large number of wafer lots and to create a trend of image size and alignment vs. yield. The present invention allows for optimization of overlay tolerance using a reduced number of wafers; preferably a single wafer; and even more preferably, a single chip.

According to one aspect of the present invention there is provided a photolithography device comprising:
  a substrate; and
  a pattern layer including pattern features, said pattern layer having radiant energy transparent portions and radiant energy blocking portions, wherein the pattern features produce a varying overlay.

More specifically, the photolithography device comprises a pattern layer having opaque and clear areas that respectively prevent or allow light to expose photoresist. The photolithographic device may be a reticle, which may be interchangeably referred to as a photomask. Preferably, the reticle may include a pattern image for a complete wafer, where the pattern is transferred to the wafer in a single exposure (1:1 image transfer). Preferably, the reticle may include the pattern image for a portion of the wafer and may be sized 4×–10× larger than the actual image to be patterned. Reticles may be used in conjunction with a step and repeat stepper or step and scan system that repeat the reticle pattern across an entire wafer through multiple exposures. The step and repeat stepper or step and scan systems may utilize reduction lenses to print the desired feature size.

The overlay of the present invention is intentionally varied by intentionally misaligning the pattern features in the reticle design. Varying the image size, of the pattern features, i.e., critical dimension, may also vary the overlay. For example, the alignment of the pattern features may be varied by intentionally misaligning the pattern features in increasing and decreasing increments from a target feature alignment on the reticle. For example, the critical dimension may be varied by intentionally designing features having an image size in increasing and decreasing increments from a critical dimension target on the reticle. The reticle design may also include test pads for measuring interaction between the printed pattern features of varying alignment and varying image size. The test pads may be contacted with electrical probes during in line testing of the printed pattern features in order to determine the overlay and critical dimension tolerances electrically.

Another aspect of the present invention is a method of optimizing the process window of a photolithography process using the above described photolithography device, where the photolithography device is created on a single reticle. The inventive method for determining an optimum photolithography process window comprises:

exposing a portion of a wafer to a pattern produced by a reticle, the pattern producing varying overlay conditions, wherein each overlay condition has an overlay tolerance; and stepping the reticle across a remaining portion of the wafer, where each step exposes an other region of the wafer to the pattern producing varying overlay conditions;

producing test structures from said varying overlay conditions; and testing said test structures to determine the optimum process window.

The above method may then be repeated to process the multiple levels of a device, where the next level of the device has a corresponding pattern with the previously processed layer. The test structure may then be tested to determine the optimal photolithography process window.

The present invention uses a reduced number of wafers to optimize the photolithography process window by determining the overlay tolerance with a reticle pattern that varies the overlay by incrementally misaligning pattern features and/or incrementally changing the feature image size. The overlay may be varied to determine the tolerance of the multiple layers and the interaction therebetween. By providing a reticle pattern design that varies the overlay, the process window for providing optimal image size and feature alignment can be determined using a single wafer, preferably a single chip, as opposed to an entire lot of wafers.

In one embodiment, test structures produced using a reticle having a varying feature alignment and varying image size may be repeated multiple times on a single wafer using a step and repeat system. In this embodiment, wafer regionality effects may also be analyzed.

Another aspect of the present invention is a test wafer produced using the inventive method. In broad terms, the test wafer comprises:

a plurality of test regions; and a plurality of test structures within each of the test regions, each test structure having a different alignment between a chain feature and a line feature, the chain feature and line feature each in contact with at least one test pad, wherein a total number of test pads within each the test regions is equal to:

a first number of test structures formed by a first photolithography condition multiplied by a first number of test pads required to measure each of the first number of test structures formed by the first photolithography condition, plus one or more other test structures formed by one or more other photolithography conditions multiplied by one or more other number of test pads required to measure each of the one or more other test structures formed by the one or more other photolithography conditions, wherein the first photolithography condition is a first alignment between the chain and line feature, and the one or more other photolithography conditions is another alignment between the chain and line feature.

Alternatively, each test structure may comprise a different image size instead of or in combination with line features and chain features having a varying alignment.

Further benefits and advantages of the invention will become apparent from a consideration of the following detailed description, given with reference to the accompanying drawings, which specify and show preferred embodiments of the invention.

BRIEF DESCRIPTION OF DRAWINGS

FIG. 1 represents the top view of a pattern matrix having varying overlay and critical dimensions.

DETAILED DESCRIPTION

Figure 2:
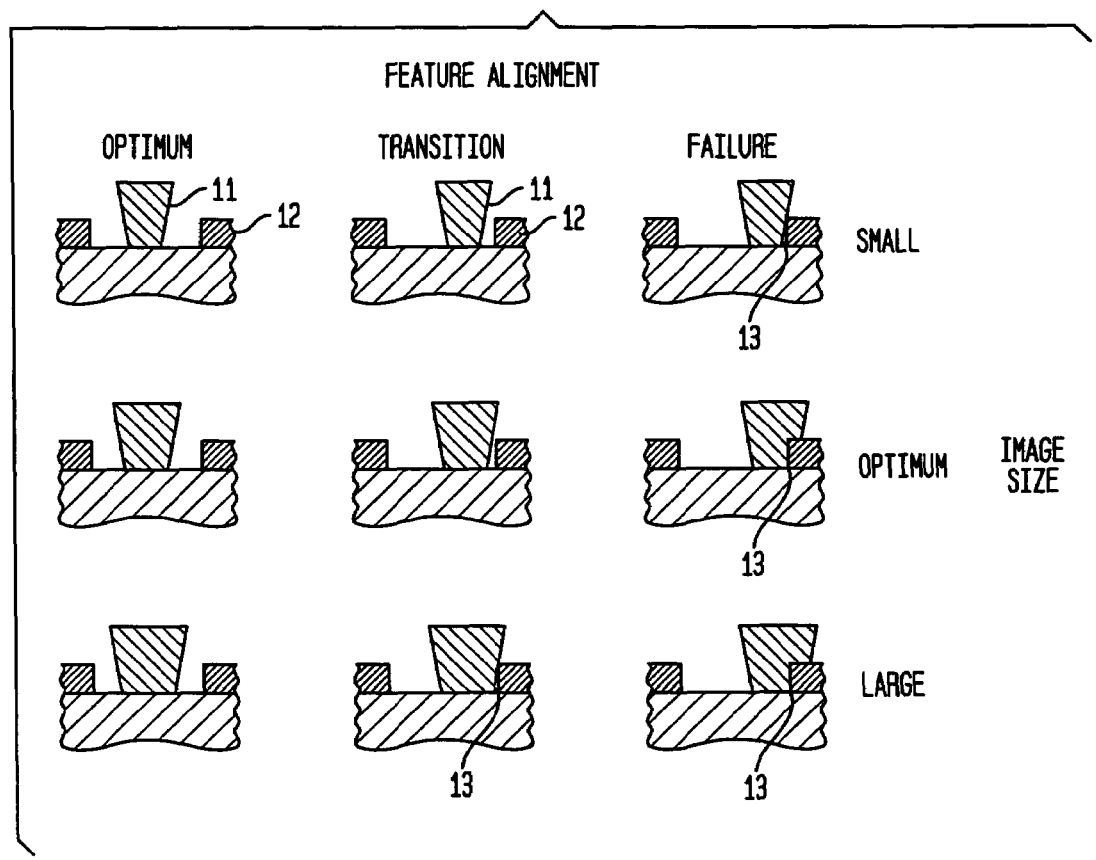
FIG. 2 illustrates the results of exposing the wafer to different critical dimensions and overlays to determine the overall tolerances.

The present invention will now be discussed in greater detail by referring to the drawings that accompany the present application. It is noted that in the accompanying drawings like reference numerals are used for describing like and corresponding elements.

The present invention provides a method for determining the optimum photolithography process window using a single wafer chip, which can be used across a whole wafer to account for regional effects. The optimum photolithography process window is defined as the photolithography process conditions, i.e., critical dimension, overlay tolerance, wafer regionality, which will produce functioning devices for a specific technology. The invention utilizes the principal that overlay tolerance is a function of image size. For example, increasing the image size reduces the overlay tolerance for producing functioning devices and decreasing the image size, i.e. critical dimension, increases the overlay tolerance for producing functional devices. In another example, tightening the pattern alignment of the overlay tolerance by 10.0 nm is virtually equivalent to reducing the critical dimension by 20.0 nm because the overlay includes both a positive and a negative vector.

An aspect of the present invention is a reticle pattern design that produces a varying overlay. The reticle pattern produces a varying overlay by intentionally misaligning the pattern features. The reticle pattern may also have features with a varied image size as well. The reticle comprises a transparent substrate and a pattern layer. The substrate may be borosilicate glass or quartz. The pattern layer comprises a radiant energy transparent portion and a radiant energy blocking portion. The radiant energy blocking portion may be comprised of chrome, chrome oxide, chromium nitride, iron oxide, silicon or a number of other opaque materials.

Varying overlay through the reticle is achieved by intentionally designing the features of the pattern design in incremental degrees of misalignment from the target pattern alignment to be printed on the wafer surface. The target pattern alignment is the alignment of the pattern features as ideally reproduced on the wafer surface during printing. For example, the overlay may be varied from the target structure the pattern would ideally produce to a pattern that would likely create a chain-line short, chain resistance, or chain open. Additionally, the image size of the features of the reticle pattern may also be varied in increasing or decreasing increments from the target dimension. The target dimension is the dimension of the features the pattern would ideally reproduce on the wafer surface. Varying feature alignment and image size through the pattern of the reticle produces test structures having a varying overlay, which may be repeated multiple times on a single wafer. Each test structure corresponds to a photolithographic condition, where each photolithography condition has an assigned feature alignment and assigned image size, from which overlay tolerance may be determined.

A reticle design 10 in the form of a grid having varying feature alignment and critical dimension is illustrated in FIG. 1. In the embodiment depicted in FIG. 1, the grid is a matrix having and X-axis and a Y-axis adapted for providing a varying overlay, from which the overlay tolerance may be determined. Although the embodiment depicted in FIG. 1 is one example of the grid, it is noted that reticles comprising grids of other sizes and configurations are also contemplated and therefore included within the scope of the present disclosure.

In one embodiment, the target dimension Y and target feature alignment X process conditions are depicted towards the center of the reticle grid, as indicated in FIG. 1. In the embodiment depicted, the overlay may be varied across the reticle design in increasing increments from the grid center, i.e., X+1, X+2, X+3, in a first direction or decreasing increments, i.e., X-1, X-2, X-3, in a second direction. For example, the features may be misaligned with increasing misalignment where the features are brought closer together until the chain feature 11 contacts the line feature 12 producing a chain-line short, indicated as a failure 13 in FIG. 2. Conversely, the features may be misaligned in a manner that would separate the features by an incrementally increasing distance from an ideal alignment.

The image size may also be varied across the reticle grid in increasing increments from the gird center, i.e., Y+1, Y+2, Y+3, in a first direction or decreasing increments, i.e., Y-1, Y-2, Y-3, in a second direction. In one example, increasing the image size or decreasing the image size of the pattern features from a target critical dimension may vary the critical dimension.

Figure 3:
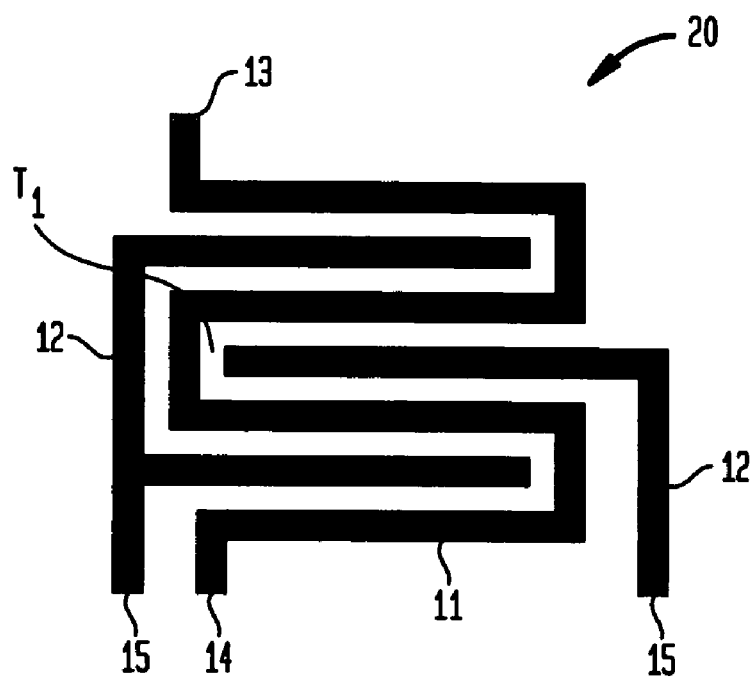
FIG. 3 depicts a test structure formed according to the present invention to determine sheet resistance, metal shorts or opens.

Thus, in the embodiment depicted in FIG. 1, the 6×7 reticle grid varies the overlay to produce about 42 photolithography conditions, where each photolithography condition represents the combination of a feature alignment, i.e. X, X+1, X+2, etc., and a image size value, i.e., Y, Y+1, Y+2, etc. Each condition produces a test structure 20, as shown in FIG. 3. By varying the image size and the feature alignment in the reticle design, multiple test structures 20 may be printed onto a portion of a single test wafer, which may be a single chip. The unfilled regions of the preferred reticle indicate the photolithography conditions for an acceptable process window that would likely result in a functioning device. Referring back to FIG. 1, the shaded regions of the preferred recticle grid indicate the photolithography conditions of an unacceptable process window that may result in a failing device.

FIG. 2 illustrates the results of exposing a wafer to a reticle that varies the overlay and illustrates the interaction between alignment and image size. One form of device failure occurs when a chain feature 11 contacts a metal line feature 12. As the image size increases the sensitivity to feature alignment also increases. As the image size decreases the sensitivity to changes in feature alignment also decreases. Still referring to FIG. 2, when processing within the optimal feature alignment the image size of the features is of lesser significance than when operating in a transitional feature alignment. For example, a large image size (i.e., Y+3) in the optimal feature alignment (i.e., X) produces an operative device; but a large image size (i.e., Y+3) in a transitional feature alignment (i.e., X-2) results in a failing device.

Another aspect of the present invention is a method for optimizing the photolithography process window for a specific technology using the above described reticle design or photomask pattern on a reduced number of wafers, preferably being a single wafer.

A wafer is first produced using a planar insulating layer deposited on a conventional wafer. This insulating layer may be a chemical-vapor deposited (CVD) silicon oxide and may be deposited to a thickness that is typically used on product wafers, such as between about 3000 Å and about 8000 Å. Alternatively, the insulating layer may comprise oxides, nitrides, oxynitrides or combinations thereof. Next, a photoresist layer, ranging in thickness from about 500 Å to about 10,000 Å, is deposited on the test substrate.

Following photoresist deposition, the photoresist layer is then exposed to radiation. In a preferred embodiment, a recticle is used with a step and align stepper or step and scan system to expose the wafer. During alignment and exposure, the reticle 10 (FIG. 1) is aligned to the correct location of the resist-coated test wafer. Once aligned the reticle and test wafer are exposed to controlled UV light to transfer the pattern features to a portion of the resist-coated wafer. The light energy activates the photosensitive components of the photoresist.

Following exposure the reticle is then stepped to another portion of the wafer by a step and repeat aligner (stepper or scanner). Steppers and scanners are tools that project only one exposure field, which may be one chip on the wafer, and then step to the next location on the wafer to repeat the exposure. Each step and exposure patterns a field, which might be a chip, on the wafer. By exposing the wafer to multiple exposures using the above-described reticle the same test structures may be repeated on a single wafer multiple times, where each exposure produces a chip having multiple test structures having varying image size and varying feature alignment.

Additionally, regionality effects may also be considered, since the same test structure is repeated on each chip of the wafer. Regionality effects occur where identical patterns on one portion of the wafer may process differently than another. By utilizing a reticle pattern that varies overlay and by stepping the reticle pattern across the wafer, a single wafer may provide optimization of image size, feature alignment, and regionality for the photolithography process window.

Following exposure of the wafer the photoresist is then processed using conventional photolithography process steps, which are known within the skill of the art; i.e., development, development inspection, etch, resist strip, and final inspection. More specifically, following exposure the exposed regions are then developed and inspected where the developed regions replicate the reticle pattern in the resist material. Photoresist development uses a liquid chemical developer to dissolve the soluble regions of the resist that were formed during the mask exposure. Once the development of the photoresist pattern is complete, the regions of the wafer covered by the photoresist are protected while the exposed regions are removed using a selective etch process that removes the unprotected regions.

This may be repeated in a dual damascene process, where both the metal and via levels are patterned before metallization. Whether utilizing a single damascene or dual damascene approach, a metallization process is conducted following etch process steps. The metallization process may comprise convention processes well known within the skill of the art, including but not limited to: liner deposition, metal deposition, and polish.

Following metallization the test structures are then tested to determine the optimum process window. Referring to FIG. 3, each test structure 20 is tested using an in line test, where the test structure 20 provides yield and parametric information on the interaction between the chain 11 and line 12 features of the test structure 20. The chain feature 11 connects a first test pad 13 to a second test pad 14 and the line 12 is connected to a third pad 15. The in-line test is an electrical test that sends current through the test pads to detect shorts between the via layer, interlevel layer, and/or intralevel layer; opens between the via layer and intralevel layer; and resistance. Those skilled in the art may determine the interaction between the levels and determine which failures are caused by which interactions. It should be understood that other defects and parametrics can be tested using this invention.

One example of the use of this invention is that chain to line shorts can occur where the process window is outside the acceptable overlay tolerance, where the distance separating the chain 11 from the line 12 drops below the minimum space T1 of the test structure 20 and the line 12 contacts the chain 11, as depicted in FIGS. 2 and 3. Chain open occurs in multi-layered structures where the alignment between the first and second layer is so misaligned that the deposited metal features of each layer fail to contact one another resulting in a discontinuity of interconnection.

Figure 4:
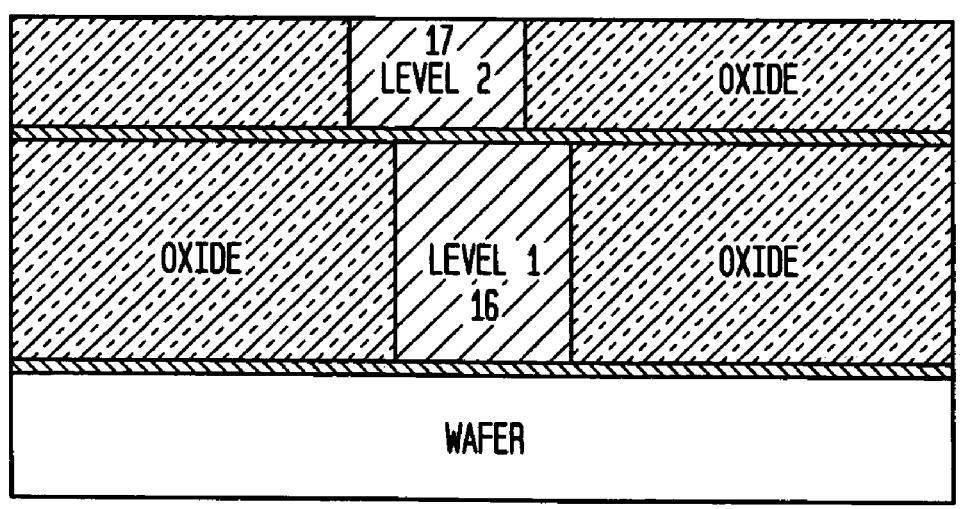
FIG. 4 depicts a structure demonstrating chain resistance or intralevel opens.

Referring to FIG. 4, overlay misalignment in a multilayer structure may result when a first metal layer 16 and second metal layer 17 are in contact but misaligned in a manner that reduces the cross section of the first metal layer 16 and second metal layer 17 contact, resulting in increased resistance, or open if contact or metal layer is sufficiently misaligned with respect to the other patterns.

Figure 5:
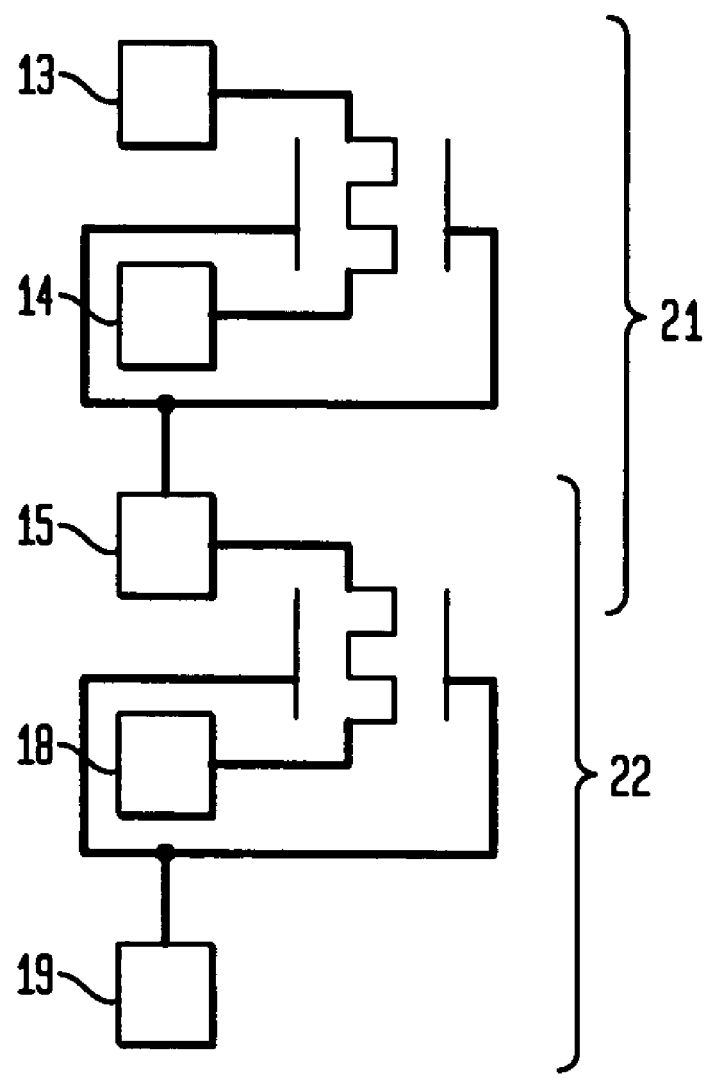
FIG. 5 depicts a test pad schematic.

Each test structure on the wafer is printed under a photolithography condition having a feature alignment and image size value. Each condition may be evaluated with inline measurements using the testing structure having a number of test pads. Referring to FIG. 5, each photolithography condition may require two test pads for testing a chain and one additionally test pads for determining a short, for a total of three test pads. Due to possible test pad sharing while testing individual chips contained on a single test wafer only the first chip having the first photolithography condition 21 may require three test pads 13, 14, 15 where each successive chip having successive photolithography conditions 22 may require only two test pads 18, 19. The number of test pads for each exposed region or chip may be determined by the following relationship:

total test pads=[(#$N$ condition)×(#test pads for $N$ condition)]+[(#$N''$ condition)×(#test pads for $N''$ condition)]

Where N condition is a first photolithography condition and N" condition is another photolithography condition. The # test pads for N condition equals the number of test pads to test the first photolithography condition and the # of test pads of N" condition equal the number of test pads to test another photolithography condition.

In the embodiment depicted in FIG. 1 directed to a 6×7 reticle grid, testing a wafer formed containing 42 possible photolithography conditions may require 85 test pads ((1 condition×3 test pads)+(41 conditions×2 test pads)= 85 test pads). By measuring the electrical properties of the 42 conditions on a single chip the optimal process window may be determined. The present invention thus provides process engineers with a valuable tool to optimize the process window for photolithography using reduced raw materials.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for determining an optimum photolithography process window comprising:
exposing a portion of a single wafer to a pattern of a reticle, said pattern having pattern features producing varying overlay conditions, wherein each of said varying overlay conditions has a different overlay tolerance contributed by both varying image size and pattern feature alignment built into a reticle design;
stepping said reticle across one or more remaining portions of said single wafer, where each step exposes an other region of said wafer to said reticle pattern features producing said varying overlay conditions;
producing test structures from said varying overlay conditions;
and testing said test structures to determine said optimum photolithography process window.

2. The method according to claim 1 wherein said pattern features further comprise a varying feature alignment and said each of said varying overlay conditions further comprises a feature alignment.

3. The method according to claim 2 wherein said varying feature alignment further comprises said pattern features misaligned in incremental degrees from a target feature alignment.

4. The method according to claim 1 wherein said pattern features further comprise a varying image size, wherein said each overlay condition further comprises an image size.

5. The method according to claim 4 wherein said varying image size further comprises said pattern features dimensioned in increasing and decreasing increments from a target dimension.

6. The method according to claim 1, wherein said optimum photolithography process window takes into account regionality effects of the single wafer.

7. A method for determining an optimum photolithography process window comprising:
exposing a single chip in a wafer to a pattern of a reticle, said pattern having pattern features capable of producing varying overlay conditions, wherein each overlay condition of said varying overlay conditions has a different overlay tolerance contributed by both varying image size and pattern feature alignment built into a reticle design;
producing test structures from said multiple overlay conditions at said single chip; and testing said test structures, wherein an optimum photolithography process window is determined from exposing a single chip on said wafer.

8. The method according to claim 7, further comprising stepping said reticle across one or more single chip portions of said single wafer, where each step exposes an other region of said wafer to said reticle pattern features producing said varying overlay conditions, wherein said optimum photolithography process window takes into account regionality effects of the single wafer.

* * * * *